(12) United States Patent
Gubba Ravikumar et al.

(10) Patent No.: US 11,500,407 B2
(45) Date of Patent: Nov. 15, 2022

(54) BOUNDARY SEPARATION SCHEME FOR FAULTS IN POWER SYSTEMS

(71) Applicant: Schweitzer Engineering Laboratories, Inc., Pullman, WA (US)

(72) Inventors: Krishnanjan Gubba Ravikumar, Pullman, WA (US); Bharath Nayak, Pullman, WA (US); Christopher P. Knox, Pullman, WA (US); Ceeman B. Vellaithurai, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 349 days.

(21) Appl. No.: 16/790,244

(22) Filed: Feb. 13, 2020

(65) Prior Publication Data

US 2021/0255655 A1 Aug. 19, 2021

(51) Int. Cl.
*G05F 1/66* (2006.01)
*G01R 31/08* (2020.01)
(Continued)

(52) U.S. Cl.
CPC .............. *G05F 1/66* (2013.01); *G01R 31/08* (2013.01); *H02H 3/265* (2013.01); *H02H 3/286* (2013.01); *H02J 13/00007* (2020.01)

(58) Field of Classification Search
CPC ....... G05F 1/66; G01R 31/08; G01R 19/2513; G01R 31/086; H02H 3/265; H02H 3/286; H02H 7/263; H02J 13/00007; H02J 3/0012; H02J 13/00002; Y02E 60/00; Y04S 10/18; Y04S 40/121; Y04S 10/30; Y04S 10/52
See application file for complete search history.

(56) References Cited

U.S. PATENT DOCUMENTS

| 8,346,402 B2 | 1/2013 | Guzman-Casillas |
| 9,568,516 B2 | 2/2017 | Gubba Ravikumar |

(Continued)

FOREIGN PATENT DOCUMENTS

CN 109581085 A * 4/2019 ............ G01R 29/18

OTHER PUBLICATIONS

Mulhausen, John; Schaefer, Joe; Mynam, Mangapathirao; Guzman, Armando; Donolo, Marcos: "Anti-Islanding Today, Successful Islanding in the Future" Oct. 2009.

(Continued)

*Primary Examiner* — Thomas C Lee
*Assistant Examiner* — Anzuman Sharmin
(74) *Attorney, Agent, or Firm* — Jared L. Cherry; Richard M. Edge

(57) ABSTRACT

Systems and methods to disconnect a faulted region of a power grid are described. For example, a control system may obtain a set of regions of a power grid. The control system may obtain a current magnitude and a voltage magnitude of the power grid. The control system may detect a fault in the power grid based at least in part on the current magnitude. The control system may, from the set of regions, determine a faulted region that the fault is located within based on a voltage magnitude of one or more buses in the power grid, a net change in power with respect to time of one or more regions in the set of regions, or both. The control system may send one or more signals to electrically disconnect the faulted region from the power grid.

17 Claims, 7 Drawing Sheets

(51) Int. Cl.
*H02H 3/26* (2006.01)
*H02H 3/28* (2006.01)
*H02J 13/00* (2006.01)
*H02H 7/26* (2006.01)
*G01R 19/25* (2006.01)
*H02J 3/00* (2006.01)

(56) References Cited

U.S. PATENT DOCUMENTS

| | | | |
|---|---|---|---|
| 9,798,342 | B2 | 10/2017 | Gubba Ravikumar |
| 9,906,041 | B2 | 2/2018 | Ravikumar |
| 9,912,158 | B2 | 3/2018 | Ravikumar |
| 10,333,301 | B2 | 6/2019 | Gubba Ravikumar |
| 10,381,835 | B1 | 8/2019 | Gubba Ravikumar |
| 10,401,417 | B2 * | 9/2019 | Ren .................. G01R 31/088 |
| 10,476,268 | B2 | 11/2019 | Gubba Ravikumar |
| 10,644,493 | B2 | 5/2020 | Gubba Ravikumar |
| 10,739,414 | B2 | 8/2020 | Gubba Ravikumar |
| 10,833,507 | B2 | 11/2020 | Manson |
| 2003/0014200 | A1 * | 1/2003 | Jonker ................ G01R 21/133 702/60 |
| 2011/0035065 | A1 * | 2/2011 | Schweitzer, III . H02J 13/00016 700/286 |
| 2014/0002943 | A1 * | 1/2014 | Berggren .............. H02H 7/268 361/93.9 |
| 2016/0091537 | A1 * | 3/2016 | Gaarder ............ H02J 13/00002 324/764.01 |
| 2017/0146585 | A1 * | 5/2017 | Wang ................... G01R 23/02 |
| 2018/0048143 | A1 * | 2/2018 | Okerman ............ H02H 1/0015 |
| 2018/0302011 | A1 * | 10/2018 | Ganireddy ............. F03D 9/257 |
| 2018/0316188 | A1 * | 11/2018 | Ishchenko ................ H02J 3/38 |
| 2019/0280476 | A1 * | 9/2019 | Fan ........................ G01R 31/08 |
| 2019/0305590 | A1 * | 10/2019 | Ito ............................ H02H 7/28 |
| 2020/0076338 | A1 * | 3/2020 | Alla ....................... H02P 9/006 |
| 2020/0412167 | A1 * | 12/2020 | Duan ................ H02J 13/00002 |
| 2021/0111671 | A1 * | 4/2021 | Lellis ..................... H02S 40/38 |

OTHER PUBLICATIONS

Hamilton, E. Roy; Undrill, John; Hamer, Paul S.; Manson, Scott: "Considerations for Generation in an Islanded Operation" Sep. 2009.

Gubba Ravikumar, Krishnanjan; Upreti, Ashish; Nagaranjan, Adithiya: "State-of-the-Art Islanding Detection and Decoupling Systems for Utility and Industrial Power Systems" 29 Apr.-May 1, 2015.

Manson, Scott M.; Upreti, Ashish; Thompson, Michael J.: "Case Study: Smart Automatic Synchronization in Islanded Power Systems" Mar. 2013.

Dilliot, John; Upreti, Ashish; Nayak, Bharath; Gubba Ravikumar, Krishnanjan: "Microgrid Control System Protects University Campus From Grid Blackouts" Oct. 16-18, 2018.

* cited by examiner

BOUNDARY SEPARATION SCHEME FOR FAULTS IN POWER SYSTEMS

TECHNICAL FIELD

The present disclosure relates generally to power systems and, more particularly, to detecting and locating faults in a region of a power system.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

Figure 1:
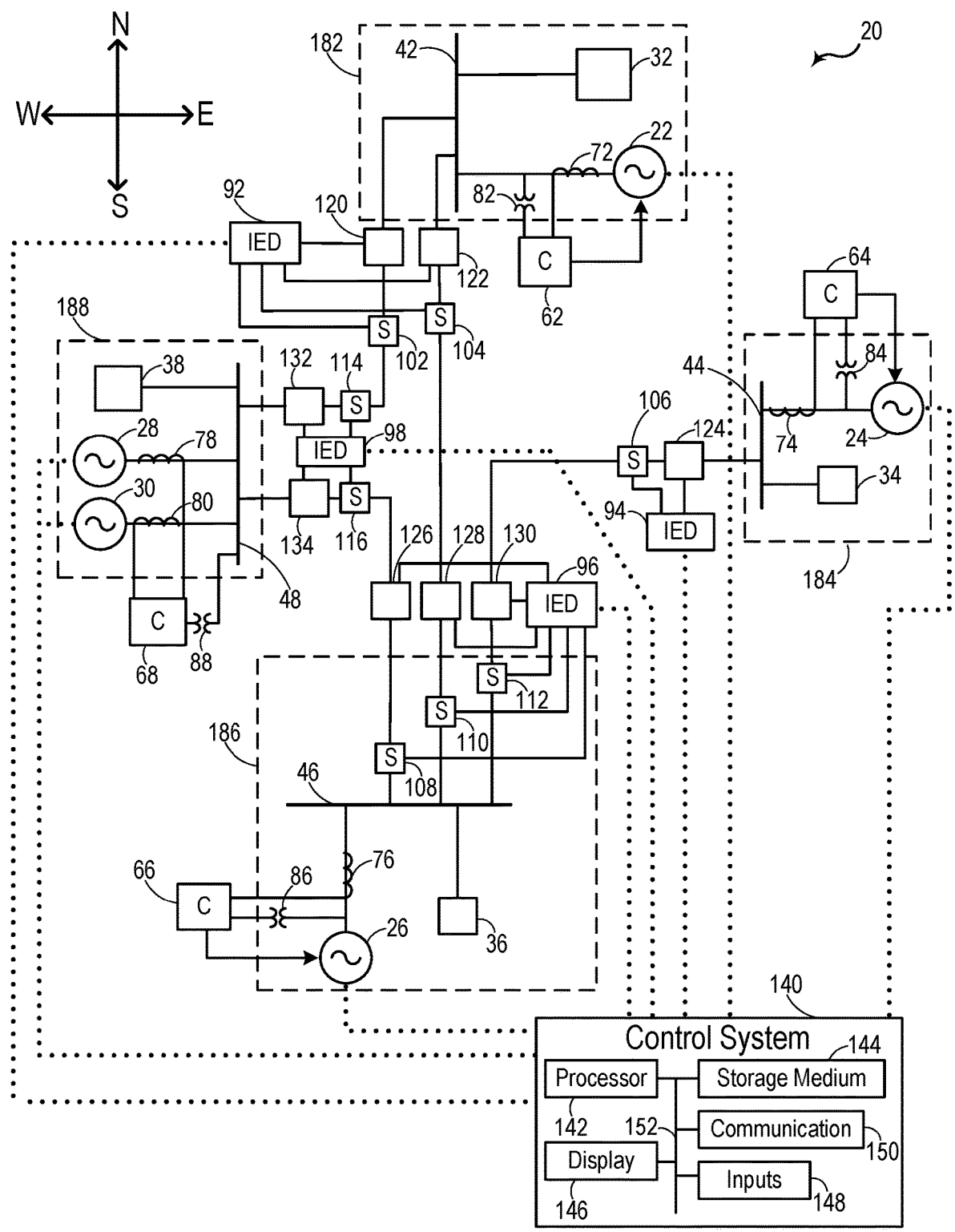
FIG. 1 is a one-line diagram of a power grid that is monitored by a control system using a boundary separation scheme, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Power grids are meshed electrical networks that connect generators to loads to allow the generators to provide electrical energy to the loads. Power grids may be protected using various protective devices. For example, protective relays and recloser controls may be installed at various locations throughout the power grid and may monitor current and/or voltage to detect faults. Upon detecting faults, the protective device may trip a circuit breaker to isolate the faulted portion of the power grid from the remaining power grid. By isolating the fault, the fault may not affect the remaining power grid, which may allow operators to address the cause of the fault.

However, in some power grids, protective devices may not provide sufficient protection from fault conditions. For example, the protective devices may be unreliable due to lack of proper maintenance or improper installation. If the equipment with the fault remains on the power grid and is not isolated, the fault may affect other regions of the power grid or the entire power grid. Accordingly, there is a need to address faults that may occur in systems without sufficient protection from protective devices. That is, there may be a desire to have high speed fault detection and remediation at a wide-area level to prevent large and island-wide outages.

As explained below, a power grid may be separated into a set of regions. A region may refer to a set of equipment on the power grid that is electrically and/or physically associated together. For example, regions may be based on location (e.g., North, South, East and West), function (e.g., industrial, residential, generation, etc.), or a combination of both. Further, any suitable number of regions may be used depending on the implementation.

A control system may monitor current and voltage measurements of the regions to detect a fault. For example, if current magnitude exceeds a threshold current, the control system may determine that a fault is present on the power grid. The control system may then determine a region in which the fault is present from the set of regions based on the voltage magnitude of buses in the power grid, the net change in power with respect to time between the regions, or both. The control system may then send one or more signals to electrically disconnect the region from the power grid to isolate the fault from the power grid. In some embodiments, the control system may isolate the faulted region when the primary protection fails.

FIG. 1 is a one-line diagram of an islanded power grid 20, such as a microgrid or macrogrid, with generators 22, 24, 26, 28, and 30 that provide power to loads 32, 34, 36, and 38. The generators 22, 24, 26, 28, and 30 may each represent any suitable power source or combination of power sources, such as distributed generators. The loads 32, 34, 36, and 38 may represent any type or combination of loads, such as industrial loads, residential loads, etc.

In the illustrated embodiment, each of the generators 22, 24, 26, 28, and 30 is connected to a bus 42, 44, 46, and 48. Further, the loads 32, 34, 36, and 38 may be connected to the buses 42, 44, 46, and 48, or may be connected to other buses in the regions. Although illustrated in single-line form for purposes of simplicity, the power system 20 may be a multi-phase system, such as a three-phase electric power delivery system.

Each of the generators 22, 24, 26, 28, and 30 may be monitored and controlled by a generator controller 62, 64, 66, and 68. The generator controller 62, 64, 66, and 68 may obtain current and voltage measurements from one or more current transformers (CTs) 72, 74, 76, 78, and 80 and potential transformers (PTs) 82, 84, 86, and 88. Although a generator controller 66 is shown as controlling both generators 28 and 30, this is simply meant to be illustrative, and each generator may be controlled by a separate generator controller. Each generator controller 62, 64, 66, and 68 may send control signals to the respective generator 22, 24, 26, 28, and 30 to control operation of the generator in providing power to the power grid 20.

The power grid 20 may be monitored by various intelligent electronic devices (IEDs) 92, 94, 96, and 98. As used herein, an IED (such as IEDs 92, 94, 96, and 98) may refer to any microprocessor-based device that monitors, controls, automates, and/or protects monitored equipment within the power grid 20. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. The IEDs 92, 94, 96, and 98 may obtain electric measurements (e.g., current and/or voltage measurements) via analog signals from sensors 102, 104, 106, 108, 110, 112, 114, and 116, such as current transformers (CTs), potential transformers (PTs), Rogowski coils, voltage dividers, or the like. In other embodiments, IEDs may obtain digitized analog signals from merging units, which obtain electrical signals from the power system and communicate the digitized analog signals to the IED.

The IEDs 92, 94, 96, and 98 may be connected to circuit breakers (CBs) 120, 122, 124, 126, 128, 130, 132, and 134 to perform protection and/or control operations on the power grid 20. For example, if an event, such as a fault, were to occur on the power line between circuit breaker 120 and 132, the IEDs 92 and 98 may detect the fault via voltage and/or current measurements from the sensors 102 and 114 and send control signal(s) to the circuit breakers 120 and 132 to trip the circuit breakers to disconnect the power line and isolate the fault from the remaining power grid 20.

The power grid 20 may be controlled by a control system 140, such as a central monitoring station. In some embodiments, the control system 140 may be located at a site of one of the generators 22, 24, 26, 28, or 30 or in a separate facility. The control system 140 may include one or more computer processors 142, a computer-readable storage medium 144, a display screen 146, inputs 148, and communication connections 150. The control system 140 may include one or more bus(es) 152 connecting the processor 142 or processing unit(s) to the computer-readable storage medium 144, the display screen 146, the inputs 148, and/or the communication connections 150. The computer-readable storage medium 144 may be embodied as memory, such as random access memory (RAM), read only memory (ROM), or a combination thereof, and may include or interface with software, hardware, or firmware modules for implementing various portions of the systems and methods described herein. The computer-readable storage medium 144 may be the repository of one or more modules and/or executable instructions configured to implement any of the processes described herein.

The processor 142 may process inputs received via the input 148 and the communication connections 150. The processor 142 may operate using any number of processing rates and architectures. The processor 142 may be configured to perform various algorithms and calculations described herein using computer executable instructions stored on computer-readable storage medium 144. The processor 142 may be embodied as a microprocessor. In certain embodiments, the processor 142 and/or the computer-readable storage medium 144 may be embodied as discrete electrical components, a general purpose integrated circuit, one or more Application Specific Integrated Circuits ("ASICs"), a Field Programmable Gate Array ("FPGA"), and/or other programmable logic devices. The processor 142 and/or the computer-readable storage medium 144 may be referred to generally as processing circuitry.

The control system 140 may include a display screen 146 that displays information to notify an operator of operating parameters of the power system 20, such as power generation, power consumption, circuit breaker status, etc. The inputs 148 may include buttons, controls, universal serial bus (USB) ports, or the like, to allow a user to provide input settings to the control system 140. For example, the topology of the power system 20 may be stored in the computer-readable medium 144 of the control system 140 via the inputs 148. In some embodiments, the display screen 146 may be a touchscreen display. The communication connections 150 may include communication ports, such as ethernet and serial ports. In some embodiments, the communication connections 150 may be wireless connections via a wireless transceiver of the control system 140.

According to various embodiments, the control system 140 may comprise one or more of a variety of types of systems. For example, the control system 140 may include a supervisory control and data acquisition (SCADA) system and/or a wide area control and situational awareness (WACSA) system. The IEDs 92, 94, 96, and 98 and/or the generator controllers 62, 64, 66, and 68 may be remote from the control system 140, and may communicate over various media, such as a direct communication, over a wide-area communications network, or through other IEDs therebetween.

The control system 140 may communicate with the generator controllers 62, 64, 66, and 68 to obtain electrical measurements of the power grid 20, such as voltage measurements and current measurements. Further, the IEDs 92, 94, 96, and 98 may communicate voltage and/or current measurements. As mentioned above, in some embodiments, additional IEDs and additional circuit breaker mays be connected at various locations in the power grid 20. The IEDs 92, 94, 96, and 98 and other IEDs in the power grid 20 may operate as primary protection in which the IEDs protect the power grid 20 by disconnecting portions of the power grid 20 by opening circuit breakers upon detection of events, such as fault events. This primary protection may be unreliable for various reasons, such as due to lack of proper maintenance, improper installation, etc.

To ensure the integrity and stability of the power grid 20, the control system 140 may use a boundary separation scheme that functions as a wide-area safety net that detects and locates faults within a region of the power grid 20. The power grid 20 may be separated into regions based on physical distances and/or electrical topology of the power grid 20. In the illustrated embodiment, the generator 22, the load 32, and the bus 42 may be grouped as a northern region 182, the generator 24, the load 34, and the bus 44 may be grouped as the eastern region 184, the generator 26, the load 36, and the bus 46 may be grouped as the southern region 186, and the generators 28 and 30, the load 38, and the bus 48 may be grouped as the western region 188. While single power lines are shown connecting regions together, this is simply meant to be illustrative, and any suitable connections or set of connections between the regions may be used.

Figure 2:
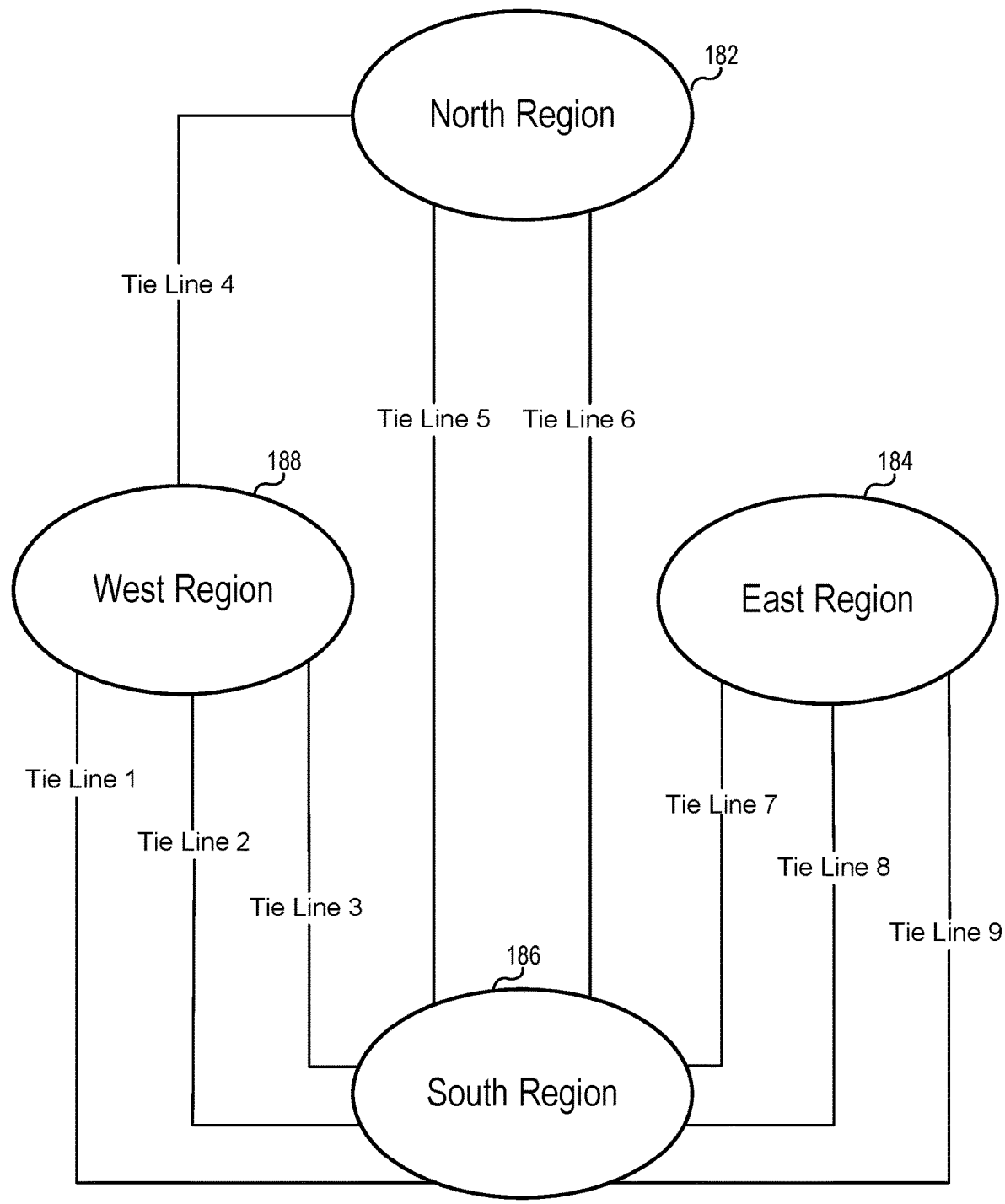
FIG. 2 is a block diagram of regions that may be included in the boundary separation scheme of the control system of FIG. 1, in accordance with an embodiment.

FIG. 2 is a block diagram of the regions 182, 184, 186, and 188 of the power grid 20 of FIG. 1, in accordance with an embodiment. One or more of the buses 42, 44, 46, and 48 may be interconnected to other buses 42, 44, 46, and 48 via one or more power lines to connect the regions together, referred to as tie lines 1-9. The IEDs 92, 94, 96, and 98 may monitor the set of tie lines 1-9 between the respective regions 182, 184, 186, and 188 or separate IEDs for each tie line may be used.

Figure 3:
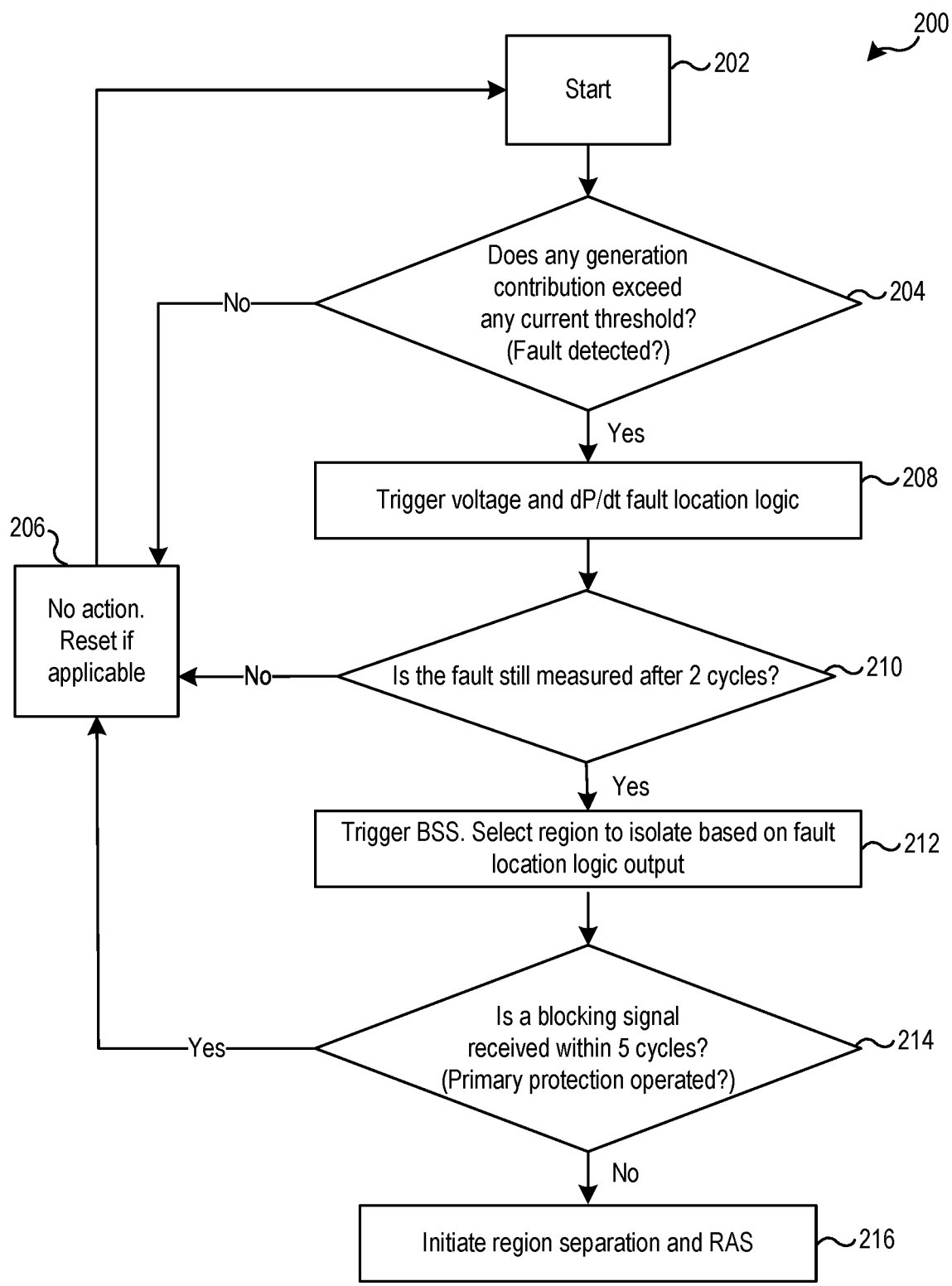
FIG. 3 is a flow chart of the boundary separation scheme performed by the control system of FIG. 1, in accordance with an embodiment.

FIG. 3 is a flow diagram of a process that may be performed by the control system 140 to disconnect a region from the rest of the power grid 20 due to a fault in the region. The process 200 may be stored on the computer-readable storage medium 144 as instructions (e.g., code) to be executed by the processor 142. The process 200 may start with the initialization steps discussed above (block 202). For example, the control system 140 may receive the topology of the power grid 20 as well as equipment of the power grid 20 being separated into a set of regions. The generators 28 and 30 may be aggregated together and analyzed as a unit. The current output of these generators may be added together and converted into per unit, based on the total megavolt-amp (MVA) of the connected machines. When generators are not aggregated together, the generators may be analyzed separately (e.g., with separate MVA and current output). Generators may be aggregated or not aggregated depending on the implementation, such as whether the generators are on the same bus, within certain distances of the same region, within a substation, etc.

The control system 140 may receive current measurements from each generator controller 62, 64, 66, and 68 of the generators (such as generators 22, 24, 26, 28, and 30) to allow for monitoring of the current output of the power grid 20. The sequence components of the current output may be compared to current thresholds, which may depend on the system characteristics. As an example, sequence components (e.g., positive, negative, and zero sequence components) of a generator output current may be compared to a 120% positive sequence threshold, 20% negative sequence threshold, and 20% zero sequence threshold to detect a fault.

The control system 140 may determine whether generator output current exceeds a current threshold (diamond 204). If each of the generator contributions of current do not exceed thresholds, the control system 140 may continue to wait for further current measurements (block 206). For example, a fault may occur on one of the loads grouped in load 38. Upon occurrence of the fault, one or more of the sequence components of the combined generator output current from the generators 28 and 30 may exceed the positive sequence current threshold, negative sequence threshold, the zero sequence threshold, or any combination thereof, indicating that a fault is present in the power grid 20.

Different generators may contribute different current outputs to faults depending on the type of fault (e.g., bolted fault, impedance fault, line-to-ground, etc.), the location of the fault, among others. Upon detecting that the generator output current exceeds a threshold, the control system 140 may activate voltage magnitude fault location logic and net power change (dP/dt) fault location logic to determine a faulted region from the set of regions (block 208).

With respect to voltage magnitude fault location logic, the control system 140 may monitor the positive sequence voltages and negative sequence voltages at the region boundary buses 42, 44, 46, and 48. Additional internal buses may be added if a particular region is large or not sufficiently represented by the boundary buses depending on the implementation. For balanced faults, the positive sequence voltages at each monitored bus may be compared to determine which of the buses 42, 44, 46, and 48 has the lowest voltage in per unit, and thus, is closest to the fault. Similarly, for unbalanced faults, the negative sequence voltages at each monitored bus 42, 44, 46, and 48 may be compared to determine which of the buses 42, 44, 46, and 48 has the greatest negative sequence voltage per unit, and thus, is closest to the fault.

With respect to the net power change fault location logic, the control system 140 may monitor the real power on the transmission lines transmitted between the defined regions. The power values of each of the tie lines connected to each of the regions 182, 184, 186, and 188 will be added together to calculate the net power entering or leaving the region 182, 184, 186, and 188. For instance, the tie lines 1, 2, and 3 of FIG. 2 may be summed together to represent the net power between the West region and the South region (e.g., as represented by the power line between CBs 126 and 134 of FIG. 1), and the tie line 4 may represent the net power being transmitted between the west region and the north region. The control system 140 may determine the net power transmitted by the west region 188 using the real power being transmitted via the tie lines 1-4. Boundary devices (i.e., IEDs 92, 94, 96, and 98) that are located between each of the regions may communicate current and voltage magnitude and phase measurements to the control system 140. In some embodiments, the IEDs 92 and 98 may communicate the current and voltage magnitude and phase measurements to the control system for analysis. In other embodiments, the IEDs 92 and 98 may determine the sequence components of the current and voltage at the IED 92 and 98 for communication to the control system 140.

If different power measurements are calculated from different boundary devices at different locations on the same power line, the higher positive sequence voltage measurement may be used for the net power calculation. For example, the control system 140 may determine a first positive sequence voltage at a first end of a power line (i.e., at sensor 102) and determine a second positive sequence voltage at a second end of the power line (i.e., at sensor 114) using the current and voltage magnitude and phase measurements. The control system may use the higher value of the first positive sequence voltage and the second positive sequence voltage in calculating power delivered between the North region 182 and the West region 188.

With the net power of each region 182, 184, 186, and 188 available, the control system 140 may calculate a derivative of the net power with respect to time (dP/dt). During a fault in a particular region, the power entering the region with the fault will temporarily increase, and the power entering the remaining regions will temporarily decrease. The changes in net power may be reflected in the derivative value and may be used by the control system 140 to determine the faulted region (i.e., the region with the fault). The derivative may be valid for a short period after the fault begins. As such, a validity window (e.g., for three cycles) may be incorporated into the metric to prevent incorrect fault locating.

The control system 140 may then determine whether the fault is still measured after a period of time (e.g., two cycles) indicating that the fault detected is not a transient anomaly (block 210). If the fault is not measured after the period of time, no action may be taken and the control system 140 may wait for further faults to be detected (block 206). If the fault is still detected after the period of time, the control system 140 may select the faulted region(s) to isolate from the results of the voltage magnitude fault location logic and net power change fault location logic (block 212).

The control system 140 may wait a period of time to allow primary protection to isolate the fault and send the necessary blocking signal to deactivate the boundary separation scheme (diamond 214). For example, if an IED is located near the fault and trips a circuit breaker to isolate the fault, then the control system 140 may receive a blocking signal indicating that the fault has been isolated from the power grid 20. If a blocking signal is received, the control system 140 may take no action with respect to the fault and may continue to monitor the power grid 20 for faults (block 206).

If no blocking signal is received by the control system 140, then the process 200 may proceed to initiate the boundary separation scheme and remedial action schemes (RAS) (block 216). For example, the control system 140 may send one or more signals to electrically disconnect the faulted region from the power grid. With respect to the example provided above in which a fault occurs on the load 38, the control system 140 may send control signal(s) to IED 98 to open CBs 132 and 134 to disconnect the faulted west region from the remaining power grid 20. By disconnecting the faulted west region, the fault on the load 38 is isolated from the remaining power grid 20 to protect the remaining equipment in the power grid 20. Other remedial action schemes may then be implemented to balance the remaining system due to the loss of generation/loads. When disconnecting the faulted region, the set of equipment connected to the power grid 20 that fall within the region may also be disconnected from the power grid 20 independent of where the fault is particularly located. For instance, if a fault were to occur on a particular load in the loads 38, when disconnecting the West region 188, each of the other loads 38, the generators 28 and 30, and the bus 48 may be disconnected from the remaining power grid 20 when disconnecting the faulted region.

Figure 4:
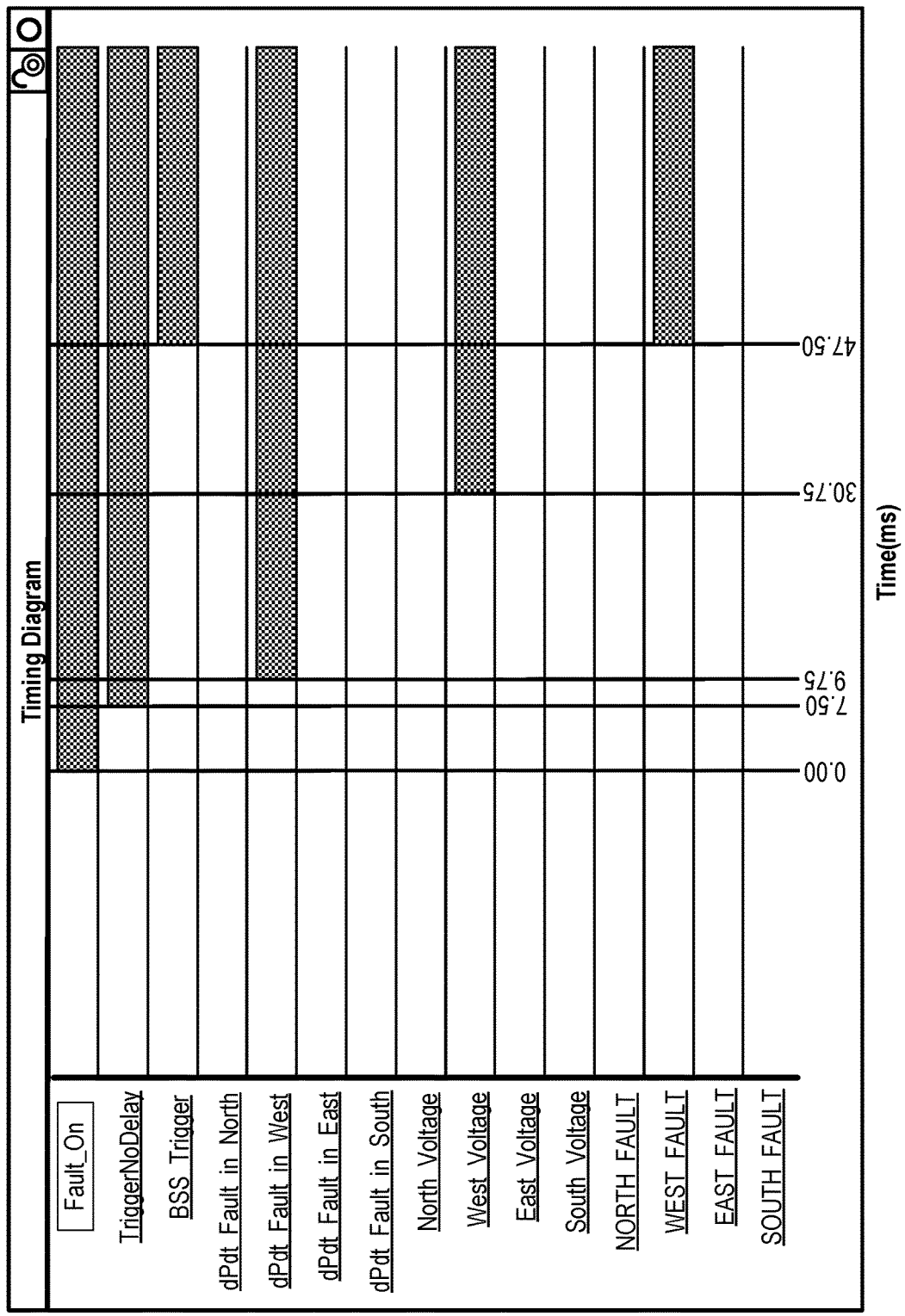
FIG. 4 is a timing diagram of a fault simulated to occur in the West region of FIG. 2, in accordance with an embodiment.

FIG. 4 is a timing diagram 200 of a simulated fault detected in the West region of FIG. 2, in accordance with an embodiment. A list of signals are included in the timing diagram 200 along with whether the signal is being asserted as true in this simulation. Fault_On indicates whether a fault is present in the simulation. TriggerNoDelay indicates that the boundary separation scheme detected a fault (without the incorporated delays). BSS_Trigger indicates that the boundary separation scheme is triggered (i.e., the fault was not a transient anomaly). The dPdt_fault_in_North/West/East/South indicates the result of the dP/dt fault location logic. North/West/East/South_Voltage indicates the result of the voltage fault location logic. NORTH/WEST/EAST/SOUTH_FAULT indicates the region that the boundary separation scheme logic has selected to isolate.

In the illustrated embodiment, the fault is detected 7.5 milliseconds (ms) after the fault occurred. The net power change fault location logic determined the fault region at 9.75 ms. In this particular simulation, a spike in negative-sequence voltage caused the voltage logic to toggle between two buses closest to the fault. To prevent mis-determinations during this transition period, the control system 140 may include a pickup timer that delays determination of the faulted region based on the voltage magnitude for a period of time. At 30.75 ms, the control system 140 determines that the fault is within the West region because the West voltage has the greatest negative sequence voltage.

Figure 5:
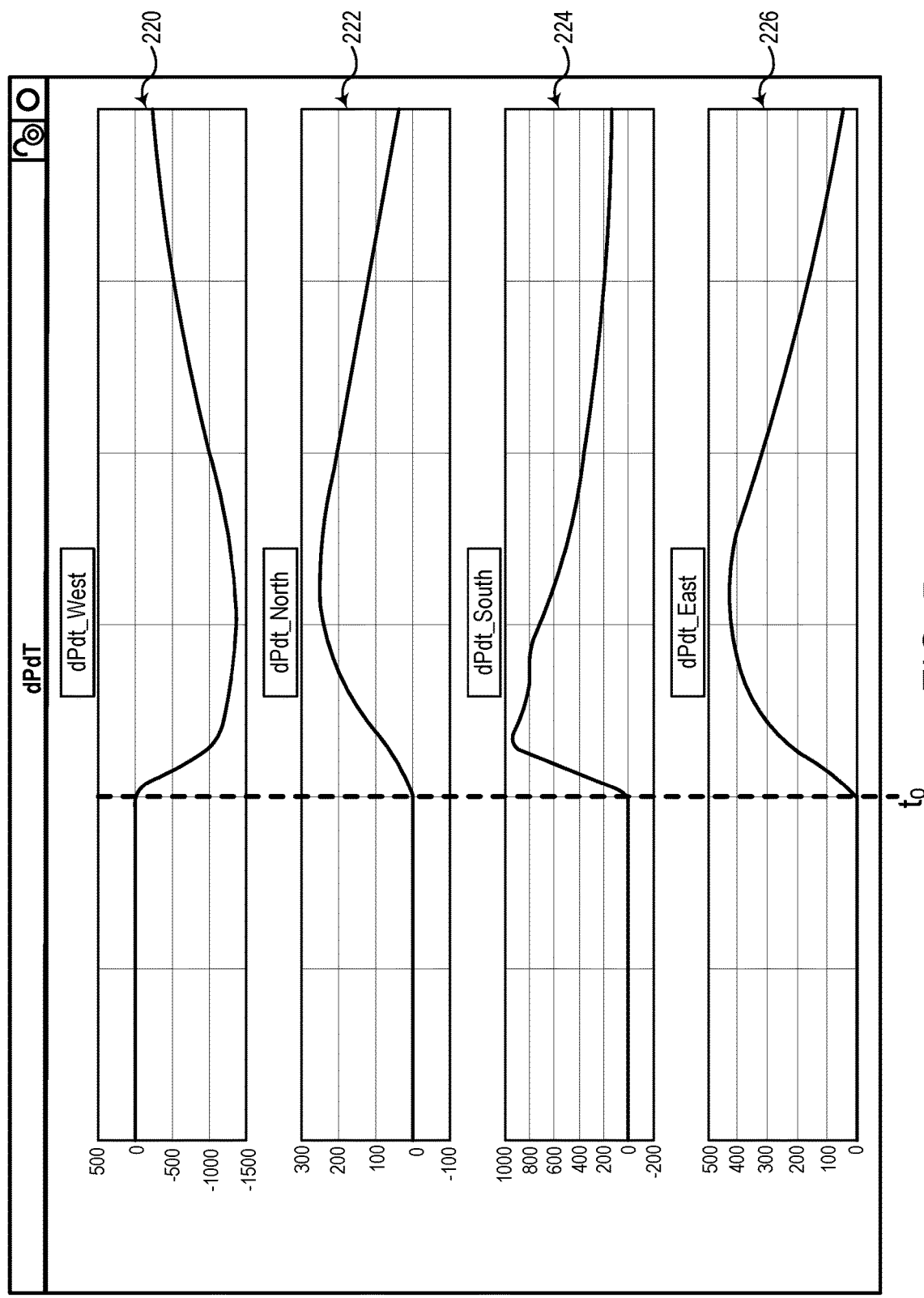
FIG. 5 is a set of plots of the derivative of power with respect to time of each of the regions of FIG. 2 for a fault simulated to occur in the West region, in accordance with an embodiment.

FIG. 5 is a set of plots of net power change over time in the North, South, East, and West regions during a fault in the West region at time to. As illustrated, a plot 220 of net change in power of the West region has a negative dP/dt indicating that the West region is importing more power while plots 222, 224, and 226 of net change in power of the North, South, and East regions have positive dP/dt values due to exporting power to the fault. Thus, the control system 140 determines that the faulted region is the West region due to the negative dP/dt in the West and the positive dP/dt in the North, South, and East regions.

Figure 6:
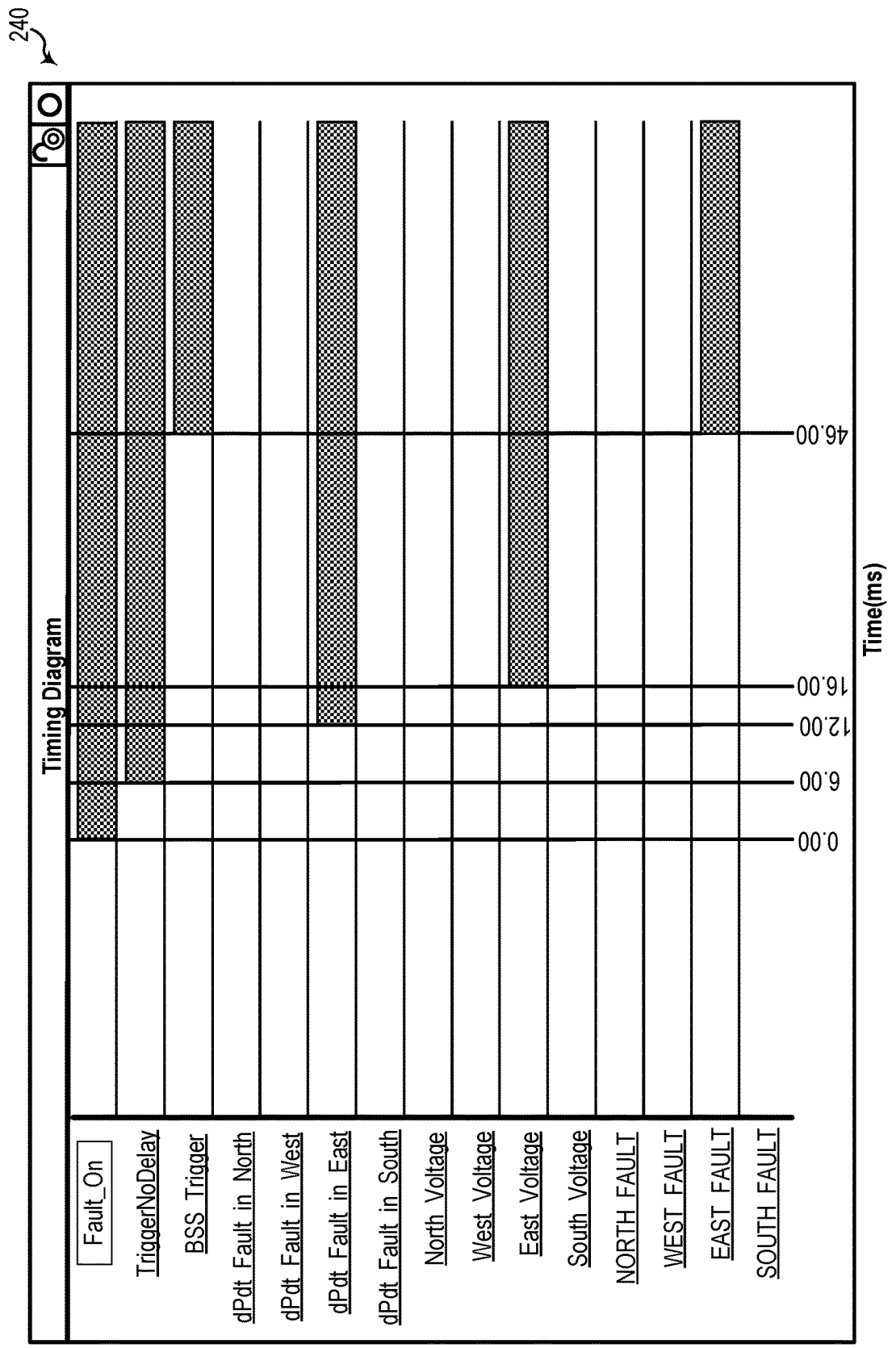
FIG. 6 is another timing diagram of a fault simulated to occur in the East region of FIG. 2, in accordance with an embodiment.

FIG. 6 is a timing diagram 240 of a simulated fault detected in the East region of FIG. 2, in accordance with an embodiment. As illustrated, a fault is detected, via one or more sequence networks of current exceeding thresholds, 6 milliseconds after a fault occurred at time 0. The control system 140 identified the East region as being the faulted region at 12 milliseconds from the occurrence of the fault due to the net change in power to and from regions in the power grid 20. The control system 140 then confirms that the East region is the faulted region based on the positive and negative sequence voltage magnitude of regional boundary buses 42, 44, 46, and 48.

Figure 7:
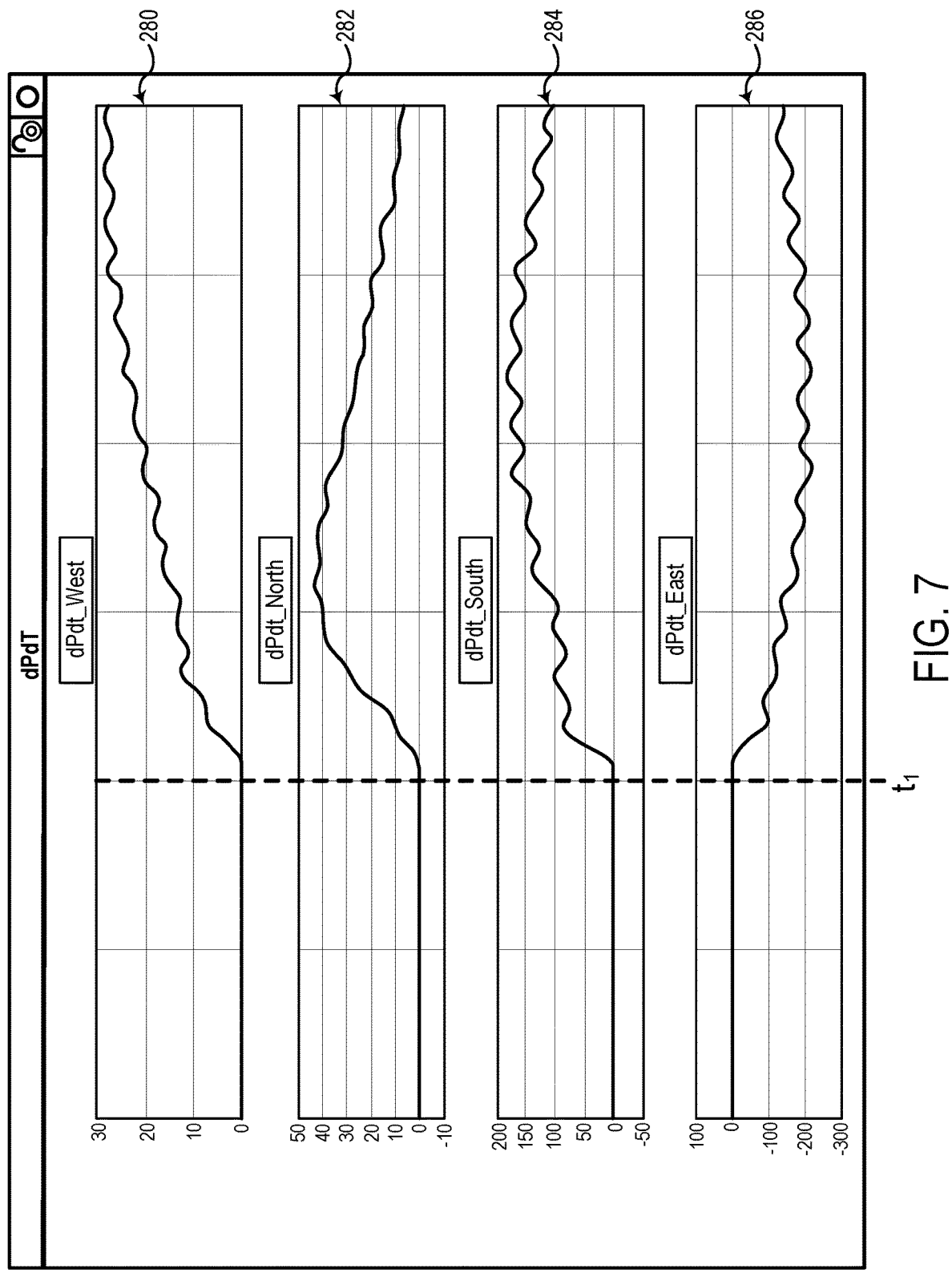
FIG. 7 is a set of plots of the derivative of power with respect to time of each of the regions of FIG. 2 for a fault simulated to occur in the East region, in accordance with an embodiment.

FIG. 7 is a set of plots of net power change over time in North, South, East, and West regions when a fault occurs in the East region 184. A plot 286 of net change in power of the East region 184 has a negative dP/dt indicating that the East region is importing more power while plots 280, 282, and 284 of net change in power of the North, South, and East regions have positive dP/dt values due to exporting additional power to the fault. Thus, the control system 140 determines that the faulted region is the West region due to the negative dP/dt in the West and the positive dP/dt in the North, South, and East regions.

In various embodiments, the control system 140 may implement the voltage magnitude fault location logic, the net change in power fault location logic, or a combination of both. For example, the voltage magnitude fault location logic may be used in events in which the change in power is smaller than a threshold to improve reliability of the system. In some embodiments, if it is determined that the fault could potentially be in two different regions, the control system 140 may send signals to disconnect both of the regions from the remainder of the power grid.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:
1. A control system, comprising:
a memory; and
a processor operatively coupled to the memory, wherein the processor is configured to execute instructions stored on the memory to cause operations comprising:
obtaining a set of regions of a power grid;
obtaining one or more current measurements of one or more generators of the power grid;
obtaining one or more voltage measurements of one or more buses of the power grid;
detecting a fault in the power grid based at least in part on the one or more current measurements;

from the set of regions, determining a faulted region within which the fault is located based on the one or more voltage measurements, a net change in power with respect to time of one or more regions in the set of regions, or both;
determining power delivered to or from each region in the set of regions;
calculating a derivative of the power delivered to or from each region as the net change in power with respect to time for the respective region;
determining that a region of the set of regions is importing more power than was previously imported from a decrease in the net change in power being delivered;
selecting the region that is consuming more power as the faulted region; and
sending one or more signals to electrically disconnect the faulted region from the power grid.

2. The control system of claim 1, wherein the instructions are configured to be executed by the processor to cause operations comprising:
determine a current output in per unit based on an associated generator megavolt-ampere (MVA) rating of one or more generators of the power grid;
based on the current output, determine a positive sequence current magnitude as the current magnitude; and
compare the positive sequence current magnitude to a positive sequence current threshold to determine that the fault is present in the power grid.

3. The control system of claim 2, wherein the instructions are configured to be executed by the processor to cause the processor to receive a user setting of the positive sequence current threshold.

4. The control system of claim 1, wherein the instructions are configured to be executed by the processor to cause operations comprising:
determine a current output in per unit based on an associated generator megavolt-ampere (MVA) rating of one or more generators of the power grid;
based on the current output, determine a negative sequence current magnitude as the current magnitude; and
compare the negative sequence current magnitude to a negative sequence current threshold to determine that the fault is present in the power grid.

5. The control system, of claim 4, wherein the instructions are configured to be executed by the processor to cause the processor to receive a user setting of the negative sequence current threshold.

6. The control system of claim 1, wherein the instructions are configured to be executed by the processor to cause operations comprising:
determine a current output in per unit based on an associated generator megavolt-ampere (MVA) rating of one or more generators of the power grid;
based on the current output, determine a zero sequence current magnitude as the current magnitude; and
compare the zero sequence current magnitude to a zero sequence current threshold to determine that the fault is present in the power grid.

7. The control system of claim 6, wherein the instructions are configured to be executed by the processor to cause the processor to receive a user setting of the zero sequence current threshold.

8. The control system of claim 1, wherein the instructions are configured to be executed by the processor to cause the control system to, upon electrically disconnecting the faulted region from the power grid, implement a remedial action scheme to balance remaining power generation of the power grid with remaining load of the power grid.

9. The control system of claim 1, wherein each region in the set of regions comprises a set of equipment in a geographical area, wherein each region in the set of regions comprises one or more intelligent electronic devices (IEDs) at a boundary of the region, and wherein the instructions are configured to be executed by the processor to cause the control system to send the one or more signals to the one or more IEDs at the boundary of the faulted region to electrically disconnect the set of the equipment in the faulted region from the power grid.

10. The control system of claim 1, wherein the processor is configured to execute instructions stored on the memory to cause operations comprising:
determining a first positive sequence voltage at a first end of a power line;
determining a second positive sequence voltage at a second end of the power line; and
using a higher value of the first positive sequence voltage and the second positive sequence voltage in calculating the net change in power delivered between a first region at the first end of the power line and a second region at a second end of the power line.

11. The control system of claim 1, wherein the processor is configured to execute instructions stored on the memory to cause operations comprising:
determining that the faulted region comprises a plurality of regions from the set of regions; and
disconnecting the plurality of regions.

12. The control system of claim 1, wherein the processor is configured to execute instructions stored on the memory to cause operations comprising:
sending one or more signals to electrically disconnect the faulted region from the power grid when no blocking signal is received after a period of time; and
allowing the faulted region to remain on the power grid when a blocking signal is received.

13. A method, comprising:
identifying a set of independently operable regions of a wide-area power grid interconnected by a plurality of tie lines;
obtaining a current measurement from one or more generators of the power grid;
obtaining a voltage measurement of one or more buses of the power grid;
detecting a fault in the power grid based at least in part on the current measurement;
from the set of regions, determining a faulted region within which the fault is located based on the voltage magnitude and a net change in power with respect to time of one or more regions in the set of regions;
determining power delivered to or from each region in the set of regions;
calculating a derivative of the power delivered to or from each region as the net change in power with respect to time for the respective region;
determining that a region of the set of regions is importing more power than was previously imported from a decrease in the net change in power being delivered;
selecting the region that is consuming more power as the faulted region; and,
sending one or more signals to electrically disconnect the faulted region from the power grid by disconnecting a subset of the plurality of tie lines.

14. The method of claim 13, comprising waiting for a predetermined amount of time to allow primary protection to isolate the fault prior to disconnecting the subset of the plurality of tie lines.

15. The method of claim 13, comprising, prior to disconnecting the faulted region, confirming that the fault remains on the power line by waiting a predetermined number of cycles to allow for transient faults to clear.

16. The method of claim 13, comprising receiving, via user input, the set of regions.

17. The method of claim 16, wherein the one or more current measurements comprise a combination of generator output currents from a plurality of generators.

* * * * *